(12) United States Patent
Umeki

(10) Patent No.: US 8,044,396 B2
(45) Date of Patent: *Oct. 25, 2011

(54) SEMICONDUCTOR DEVICE AND METHOD OF DESIGNING THE SAME

(75) Inventor: Nobuaki Umeki, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/153,650

(22) Filed: Jun. 6, 2011

(65) Prior Publication Data

US 2011/0233725 A1 Sep. 29, 2011

Related U.S. Application Data

(63) Continuation of application No. 12/202,672, filed on Sep. 2, 2008, now Pat. No. 7,977,124.

(30) Foreign Application Priority Data

Aug. 31, 2007 (JP) .................................. 2007-225199

(51) Int. Cl.
*H01L 23/58* (2006.01)
*H01L 21/66* (2006.01)

(52) U.S. Cl. .......................................... 257/48; 438/17

(58) Field of Classification Search .................... 438/10, 438/17, 253, 396; 257/48, 306
See application file for complete search history.

(56) References Cited

U.S. PATENT DOCUMENTS 5,977,565 A 11/1999 Ishikawa et al.
7,977,124 B2 * 7/2011 Umeki ............................ 438/17

OTHER PUBLICATIONS

Form PTO 892 from US Office Action dated Mar. 7, 2011 for U.S. Appl. No. 12/202,672.

* cited by examiner

*Primary Examiner* — Calvin Lee
(74) *Attorney, Agent, or Firm* — Cantor Colburn LLP

(57) ABSTRACT

A semiconductor device includes a first wiring layer, a second wiring layer and an insulating layer provided between the first wiring layer and the second wiring layer. A capacitor has a first electrode formed on the first wiring layer and a second electrode formed on the second wiring layer in such a manner that the second electrode overlaps with the first electrode. To the first electrode, two connection wirings are connected and, to the second electrode, two connection wirings are connected. The two connection wirings are connected to each other with low DC impedance substantially only through the first electrode. Similarly, the two connection wirings are connected to each other with low DC impedance substantially only through the second electrode.

5 Claims, 4 Drawing Sheets

CONVENTIONAL TECHNIQUE

CONVENTIONAL TECHNIQUE

2a

2b

US 8,044,396 B2

SEMICONDUCTOR DEVICE AND METHOD OF DESIGNING THE SAME

CROSS REFERENCE TO RELATED APPLICATIONS

The present application is a Continuation Application of U.S. patent application Ser. No. 12/202,672, filed on Sep. 2, 2008, the entire contents of which are incorporated herein by reference. The Ser. No. 12/202,672 application claimed the benefit of the date of the earlier filed Japanese Patent Application No. 2007-225199 filed Aug. 31, 2007, the benefit of which is also claimed herein.

BACKGROUND OF THE INVENTION

1. Field of the Invention

The present invention relates to a semiconductor device and, in particular, relates to a technique for detecting a defect of a capacitor.

2. Description of the Related Art

A semiconductor device is constructed by forming circuit elements such as a transistor, resistor or capacitor on a semiconductor substrate made of silicon or gallium arsenide and connecting the respective circuit elements through wirings. To easily inspect such semiconductor devices, it is general to use a DC (direct current) test, in which DC voltage and electric current is applied to a predetermined point of an integrated circuit formed on a semiconductor device and resulting electrical characteristics is measured to subsequently check go or no-go and to measure circuit characteristics.

Here is a case where a capacitor is formed on a semiconductor integrated circuit. The capacitor is essentially open (impedance is infinite) to a DC signal component. Accordingly, in performing a DC test, it would appear that the capacitor does not exist against the DC signal component. Accordingly, the DC test has a problem that an unexpected open state (that is, high-frequency open failure) due to a disconnection or manufacturing defect of a capacitor or wiring connected to the capacitor is difficult to detect.

SUMMARY OF THE INVENTION

In view of the foregoing problem, it is a general purpose of the present invention to provide a technique for facilitating detection of an open state due to manufacturing defect of a capacitor.

An embodiment of the present invention is related to a semiconductor device having a first wiring layer, a second wiring layer, and an insulating layer provided between the first wiring layer and the second wiring layer. The semiconductor device includes a capacitor having a first electrode formed on the first wiring layer and a second electrode formed on the second wiring layer in such a manner that the second electrode overlaps with the first electrode. Two connection wirings are respectively connected to the first electrode and the second electrode.

According to this embodiment, if any failure such as a disconnection occurs in an electrode of a capacitor or two connection wirings connected thereto, DC impedance of a path including the electrode and the two connection wirings becomes higher than that in a case where no failure occurs. Hence, any failure in the capacitor can be detected by a DC test, based on a change in DC impedance.

The two connection wirings connected to the first electrode may be connected to each other with low DC impedance substantially only through the first electrode, while the two connection wirings connected to the second electrode may be connected to each other with low DC impedance substantially only through the second electrode.

With such configuration, in a case where no failure occurs, the impedance between two nodes to which the two connection wirings are respectively connected becomes substantially zero. In case where some failure occurs, on the other hand, the two nodes are in galvanically open state, thus attaining easier failure detection by a DC test.

The first electrode and the second electrode may be rectangular and the two connection wirings connected to the first electrode may be led out from a common side of the first electrode in a first direction perpendicular to the common side. Accordingly, the two connection wirings connected to the second electrode may be led out from a common side of the second electrode in a second direction perpendicular to the common side. Here, the rectangular shape includes a square shape.

The first direction and the second direction may be opposite to each other. And the first direction and the second direction may be perpendicular to each other.

The first wiring layer is the uppermost wiring layer, and the second wiring layer is a wiring layer lower than the first wiring layer. The capacitor may further have a via hole disposed along one side of the second electrode and a third electrode connected to the second electrode through the via hole and formed on the first wiring layer. The two connection wirings connected to the second electrode may be formed on the first wiring layer and led from the third electrode.

With such configuration, if a disconnection or contact failure occurs even in the third electrode or via hole, such failure can be detected by a DC test.

Another embodiment also relates to a semiconductor device having a first wiring layer, a second wiring layer and an insulating layer formed between the first wiring layer and the second wiring layer. The semiconductor device has a capacitor having a first electrode formed on the first wiring layer and a second electrode formed on the second wiring layer in such a manner that the second electrode overlaps with the first electrode. When the capacitor is provided between a first wiring for connecting between a first node and a second node in an integrated circuit and a second wiring for connecting between a third node and a fourth node in an integrated circuit, the first electrode of the capacitor functions as a part of the first wiring and the second electrode of the capacitor functions as a part of the second wiring.

According to the embodiment, if any failure occurs in the capacitor, DC (direct current) impedance between the first node and the second node becomes higher or DC impedance between the third node and the fourth node becomes higher, and thus, such failure can be detected by a DC test.

The first node and the second node may be connected to each other with low DC impedance substantially only through the first electrode, while the third node and the fourth node may be connected to each other with low DC impedance substantially only through the second electrode.

With this configuration, if any failure occurs in the capacitor, an open state is made between the first node and the second node or between the third node and the fourth node, thus such failure can be detected more easily.

Still another embodiment of the present invention is a semiconductor device. The semiconductor device is constructed by disposing a unit cell (a basic cell). The unit cell is a unit capacitor including a first electrode formed on a first wiring layer, a second electrode formed on the second wiring layer arranged to sandwich an insulating layer with the first wiring layer in such manner that the second electrode overlaps with the first electrode, two connection wirings connected to the first electrode and two connection wires connected to the second electrode.

According to this embodiment, if a disconnection failure occurs in two connection wirings connected to an electrode of a capacitor or in the electrode, DC impedance of a path including the two connection wirings and the electrode becomes higher than that in a case where no failure occurs. Hence, any failure in the capacitor can be detected by a DC test based on a change in DC impedance.

All capacitors formed on the semiconductor device may be constructed with a unit capacitor as a unit cell. By constructing all capacitors with such unit cell, failure in all capacitors can be detected.

Still another embodiment of the present invention is a method of designing a semiconductor device. The method includes: registering a unit capacitor, which has a first electrode formed on a first wiring layer; a second electrode formed on a second wiring layer arranged to sandwich an insulting layer with the first wiring layer, in such a manner that the second electrode overlaps with the first electrode; two connection wirings connected to the first electrode; and two connection wirings connected to the second electrode; reading out a unit cell from the library and disposing the unit cell on an integrated circuit, when a capacitor is positioned between a first wiring for connecting between a first node and a second node in the integrated circuit and a second wiring for connecting between a third node and a fourth node; and connecting the first node and the second node to the two connection wirings connected to the first electrode, respectively and connecting the third node and the fourth node with the two connection wirings connected to the second electrode, respectively.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The present invention will now be described based on preferred embodiments which do not intend to limit the scope of the present invention but exemplify the invention. All of the features and the combinations thereof described in the embodiment are not necessarily essential to the invention.

A state where "a member A is connected to a member B" used herein includes a case where a member A and a member B are physically and directly connected to each other as well as a case where a member A and a member B are indirectly connected to each other through another member having no essential influence on the electrical state. Similarly, a state where "a member C is provided between a member A and a member B" includes a case where a member A and a member C or a member B and the member C are directly connected to each other as well as a case where they are indirectly connected through another member having no essential influence on the electrical state.

Figure 1A:
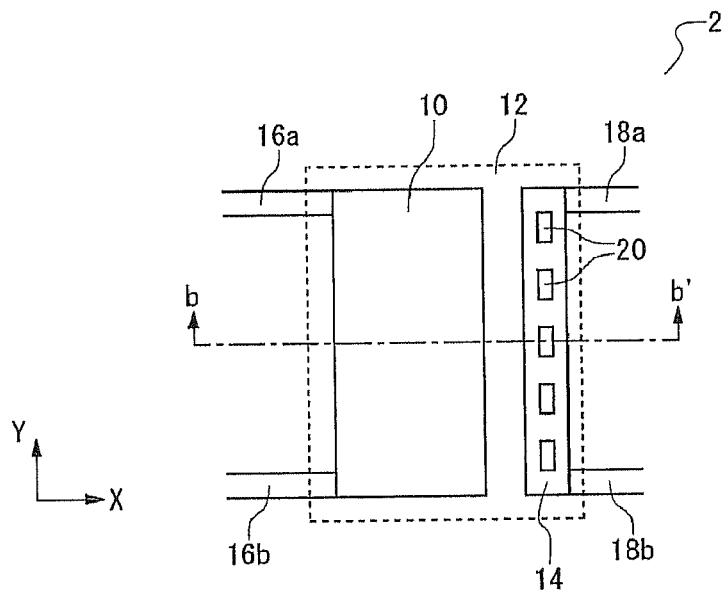
FIGS. 1A to 1C are views illustrating a configuration of a semiconductor device having a capacitor according to an embodiment.
Figure 1B:
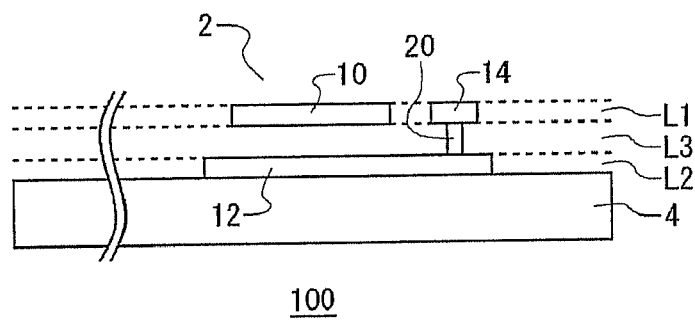
Figure 1C:
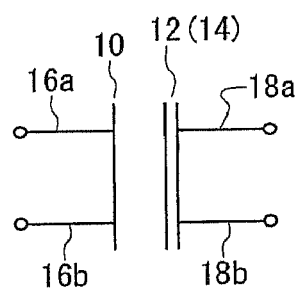

FIGS. 1A to 1C are views illustrating a configuration of a semiconductor device 100 having a capacitor 2 according to an embodiment. FIG. 1A is a top view illustrating the semiconductor substrate and FIG. 1B is a sectional view taken along line b-b' in FIG. 1A. FIG. 1C is a circuit symbol of a capacitor 2 in FIGS. 1A and 1B herein.

As illustrated in FIG. 1B, a semiconductor device 100 includes a substrate 4, a first wiring layer L1, a second wiring layer L2 and an insulating layer L3. A semiconductor integrated circuit is constructed of circuit elements using those layers such as transistor, resistor, capacitor, and wires to connect thereof.

The substrate 4 is a semiconductor substrate made of silicon, silicon germanium, gallium arsenide, or the like, or an insulating substrate such as a glass substrate. The first wiring layer L1 is an uppermost wiring layer. As an upper layer of the first wiring layer L1, a passivation film (not illustrated) is formed. The second wiring layer L2 is a wiring layer lower than the first wiring layer L1. The insulating layer L3 is provided between the first wiring layer L1 and the second wiring layer L2. Between the second wiring layer L2 and the capacitor 2, a transistor (not illustrated) or the like is formed. In the present embodiment, only two wiring layers are illustrated for simple description and easy understanding, but in practice, more wiring layers and insulating layers may be formed. On the first wiring layer L1 and the second wiring layer L2, a wiring for connecting between circuit elements is formed. For such wiring aluminum wiring or copper wiring can be used for example. Such a configuration of the semiconductor device 100 is general and therefore detailed description will not be provided.

The capacitor 2 has a first electrode 10 and a second electrode 12. The first electrode 10 is formed on the first wiring layer L1. The second electrode 12 is formed on the second wiring layer L2 in such a manner that the second electrode 12 overlaps with the first electrode 10. As illustrated in FIG. 1A, two connection leading wirings (herein after referred to as connection wiring(s)) 16a, 16b are connected to the first electrode 10. Similarly, from the second electrode 12, two connection wirings 18a, 18b are connected.

The capacitor 2 further includes a via hole 20 and a third electrode 14. The via hole 20 is disposed along one side of the second electrode 12. The third electrode 14 is formed on the first wiring layer L1 and is connected with the second electrode 12 through the via hole 20. The two connection wirings 18a, 18b connected to the second electrode 12 are formed on the first wiring layer L1 and are led out from the third electrode 14. Regarding a circuit symbol in FIG. 1C, an electrode on the side where the third electrode 14 is provided is illustrated with a double line to distinguish the side from the first electrode 10 side.

The first electrode 10 and the second electrode 12 are rectangular. The two connection wirings 16a, 16b connected to the first electrode 10 are led out from one common side (the left side in FIG. 1A) of the first electrode 10 in a first direction perpendicular to the one side (opposite direction to X-axis). The two connection wirings 18a, 18b connected to the second electrode 12 may be led out from one common side (the right side in FIG. 1A) of the second electrode 12 in a second direction perpendicular to the one side (X-axis direction). In FIG. 1A, the first direction and the second direction are opposite to each other.

Figure 2A:
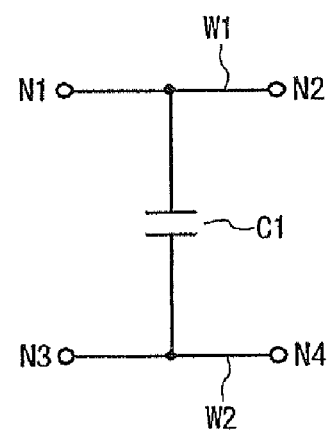
FIGS. 2A and 2B are views illustrating connection modes of a capacitor in FIGS. 1A and 1B.
Figure 2B:
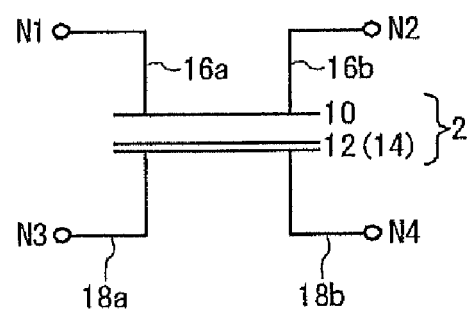

A configuration of the semiconductor device 100 having the capacitor 2 is as described above. Next, description will be made on a connection mode of the capacitor 2 using connection wirings 16a, 16b, 18a, 18b. FIGS. 2A and 2B are views illustrating connection modes of the capacitor 2 in FIGS. 1A to 1C. Here is a case where a capacitor C1 is provided between a first wiring W1 connecting between a first node N1 and a second node N2 in an integrated circuit, and a second wiring W2 connecting between a third node N3 and a fourth node N4 in an integrated circuit as illustrated in FIG. 2A.

When the capacitor 2 in FIG. 1A is used as the capacitor C1, in a preferable embodiment, the capacitor 2 is connected as shown in FIG. 2B so that the first electrode 10 of the capacitor 2 functions as a part of the first wiring W1 and the second electrode 12 functions as a part of the second wiring W2.

Looking at a connection mode in FIG. 2B from another point of view, the two connection wirings 16a, 16b connected to the first electrode 10 are connected to each other with low DC impedance substantially only through the first electrode 10. The two connection wirings 18a, 18b connected to the second electrode 12 through the third electrode 14 are connected with low DC impedance substantially only through the second electrode 12. "Low DC impedance" means that a path including the first electrode 10 is the only wiring directly connecting the first node N1 and the second node N2, or a path including the second electrode 12 is the only wiring directly connecting the third node N3 and the fourth node N4. Other than wirings, a circuit element such as a resistor or transistor, which has significant impedance, may be provided between the first node N1 and the second node N2 or between the third node N3 and the fourth node N4.

By using the capacitor 2 in FIGS. 1A to 1C, if failure such as a disconnection occurs in the first electrode 10 of the capacitor 2 or the two connection wirings 16a, 16b connected thereto, DC impedances of the path (W1) including the two connection wirings 16a, 16b and the first electrode 10 increase. Accordingly, some influence occurs on a galvanic operation of a circuit including the capacitor 2, and thus, the failure can be detected. If any failure occurs in the second electrode 12 or the two connection wirings 18a, 18b connected thereto, the failure can be detected similarly.

Especially, if the capacitor 2 is connected as illustrated in FIG. 2B so that the first electrode 10 of the capacitor 2 functions as a part of the first wiring W1 and the second electrode 12 of the capacitor 2 functions as a part of the second wiring W2, the first wiring W1 or the second wiring W2 is cut off when the capacitor 2 has some failure and therefore the circuit stops to operate. Hence, failure of the capacitor 2 can be detected more easily and reliably.

Using a more specific circuit as an example, a preferable connection mode will be described below. FIGS. 3A to 3D are circuit diagrams and mask layouts illustrating preferable connection modes of a capacitor.

Figure 3A:
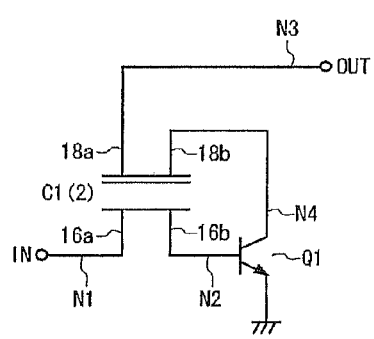
FIGS. 3A to 3D are circuit diagrams and mask layouts illustrating preferable connection modes of a capacitor.
Figure 3B:
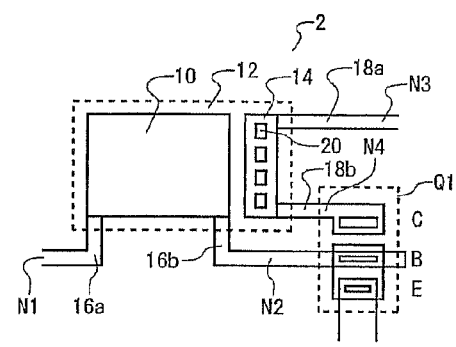
Figure 3C:
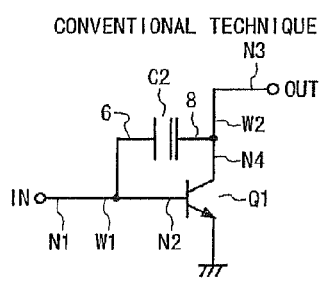
Figure 3D:
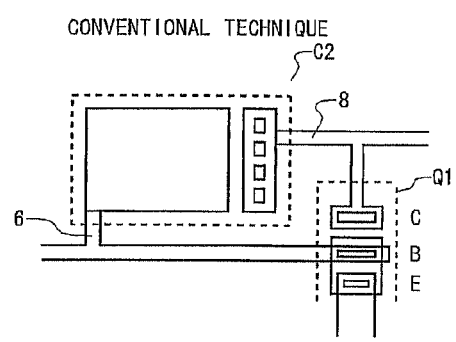

FIGS. 3A and 3B are an equivalent circuit diagram and a mask layout according to the present embodiment, respectively and FIGS. 3C and 3D are an equivalent circuit diagram and a mask layout using a conventional capacitor, respectively. FIGS. 3A to 3D illustrate a case where a capacitor C1 is provided between base and collector of an NPN bipolar transistor Q1.

At first, description will be made on a connection mode using a conventional capacitor C2 referring to FIGS. 3C and 3D. As illustrated in FIG. 3C two electrodes of the conventional capacitor C2 are respectively connected to one connection wiring. One electrode of the capacitor C2 is connected with the base of a transistor Q1, while the other electrode of the capacitor C2 is connected with the collector of the transistor Q1. As illustrated in FIG. 3D, the capacitor C2 has a first electrode 10, a second electrode 12 and a third electrode 14. The first electrode 10 and the second electrode 12 are respectively connected to connection wirings 6, 8. One connection wiring 6 is connected with the base electrode of the transistor Q1. The other connection wiring 8 is connected with the collector electrode of the transistor Q1.

On the other hand, in FIG. 3A, the capacitor 2 described in FIGS. 1A to 1C is used as a capacitor C1 provided between the base and collector of the transistor Q1. In an equivalent circuit of FIG. 3C, the first node N1 corresponds to an input terminal IN and the second node N2 corresponds to the base of the transistor Q1. The third node N3 corresponds to an output terminal OUT and the fourth node N4 corresponds to the collector of the transistor Q1. In addition, a wiring for connecting the first node N1 with the second node N2 corresponds to the first wiring W1 and a wiring for connecting the third node'N3 with the fourth node N4 corresponds to the second wiring W2. The capacitor C1 is provided in between the first wiring W1 and the second wiring W2.

Accordingly, when the capacitor 2 according to the present embodiment is used, the connection wiring 16a is connected to the first node N1 and the connection wiring 16b is connected to the second node N2, as illustrated in FIG. 3A, which means that the first electrode 10 of the capacitor 2 is used as a part of the first wiring W1 for connecting the first node N1 with the second node N2. The connection wiring 18a is connected to the third node N3 and the connection wiring 18b is connected to the fourth node N4, which means that the second electrode 12 of the capacitor 2 is used as apart of the second wiring W2 for connecting the third node N3 with the fourth node N4. FIG. 3B is a mask layout view corresponding to FIG. 3A.

In FIG. 1A, a case where a direction of the connection wirings 16a, 16b and a direction of the connection wirings 18a, 18b are opposite to each other has been described. It should be noted that a first direction in which the connection wirings 16a, 16b are led out and a second direction in which the connection wirings 18a, 18b are led out are perpendicular to each other in the mask layout view of FIG. 3B. Which means that orientations of the connection wiring 16 and the connection wiring 18 may be determined considering a positional relationship to other circuit elements and wiring efficiency.

The effect of the semiconductor device according to the present invention will be apparent from comparison of FIG. 3A with FIG. 3C. When a conventional capacitor is used, it has been difficult to detect failure in the capacitor because the failure has no effect upon a test result as long as the DC test is used even if failure such as a disconnection or a break occurs in the first electrode 10, the second electrode 12 of the capacitor, or the connection wirings 6, 8. On the contrary, when the capacitor 2 according to the present embodiment is used and connected as illustrated in FIG. 3A, the base or the collector of the transistor Q1 becomes open and the transistor does not function when some failure occurs in the capacitor 2, thus abnormality or failure in the capacitor can be detected by a DC test.

As described above, with the capacitor 2 according to the present embodiment, failure in a capacitor may be detected only by a DC test without a need of the AC test, which is disadvantageous in cost and test time.

Figure 4A:
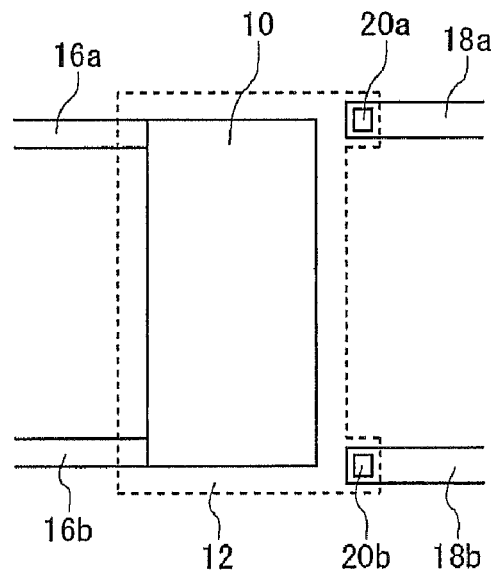
FIGS. 4A and 4B are mask layout views illustrating a modified example of a capacitor in FIG. 1A.
Figure 4B:
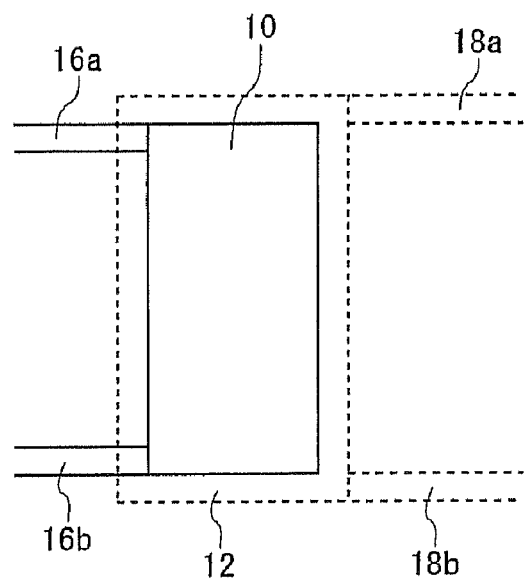

FIGS. 4A and 4B are a mask layout views illustrating modified example of a capacitor in FIG. 1A. In a capacitor 2a in FIG. 4A, the third electrode 14 is not provided, the connection wiring 18a is connected to the second electrode 12 through a via hole 20a, and the connection wiring 18b is connected to the second electrode 12 through a via hole 20b. In the capacitor 2b of FIG. 4B, the connection wirings 18a, 18b are provided on the second wiring layer L2 and connected directly to the second electrode 12 not through the via hole 20.

Also with the capacitor 2a or the capacitor 2b, failure in the capacitor can be detected by a DC test.

In designing a semiconductor integrated circuit, a concept of a unit cell (basic cell) is used. The unit cell refers to the smallest design unit in a circuit element. By connecting a plurality of unit cells, desired circuit constants, such as resistance, capacitance and emitter area, can be obtained.

In an embodiment, at least one of the capacitors 2, 2a, 2b is used as a unit cell and any capacitor in an integrated circuit is constructed using such unit cells. Preferably, all capacitors formed on the semiconductor device are constructed using the unit cells. By constructing all capacitors using unit cells, failure in any capacitor can be detected by a DC test.

To use the capacitors 2, 2a, 2b according to the present embodiment as unit cells, it is preferable that the semiconductor device is designed with the following steps.
1. The capacitors 2, 2a, 2b and the like are registered in a library of the mask design tool as unit cells.
2. When a capacitor is positioned between the first wiring W1 for connecting between the first node N1 and the second node N2 in the integrated circuit and the second wiring W2 for connecting between the third node N3 and the fourth node N4 in the integrated circuit, a unit cell is read out from the library and positioned on the integrated circuit.
3. The first node N1 and the second node N2 are respectively connected to the two connection wirings 16a, 16b connected to the first electrode 10, and the third node N3 and the fourth node N4 are respectively connected to the two connection wirings 18a, 18b connected to the second electrode 12.

The connection wirings 16a, 16b, 18a, 18b may be excluded from unit cells. Thus, the unit cells include the first electrode 10 and the second electrode 12 and if needed further include the third electrode 14 and the via hole 20.

In this case, it is preferable that the semiconductor device is designed according to the following steps.
1. The capacitors 2, 2a, 2b and the like are registered in a library of the mask design tool as unit cells.
2. When a capacitor is positioned between the first wiring W1 for connecting the first node N1 with the second node N2 in the integrated circuit and the second wiring W2 for connecting the third node N3 with the fourth node N4 in the integrated circuit, a unit cell is read out from the library and positioned on the integrated circuit.
3. The first node N1 is connected with any point of the first electrode 10 and the second node N2 is connected with any different point of the first electrode 10. Similarly, the third node N3 is connected with any point of the second electrode 12 (or the third electrode 14) and the fourth node N4 is connected with any different point of the second electrode 12 (or the third electrode 14).

In the semiconductor device designed according to the design method, a failure in a capacitor can be detected easily by a DC test.

The steps 2 and 3 in the two design methods may be performed manually by a designer, however, it is preferable to prepare such process as a function or a module of an automatic layout tool. Such automatic layout tool reads out net list of a circuit and determines a connection relationship between respective elements. The automatic layout tool uses a capacitor registered in the library as a capacitor and dispose at an appropriate position on a substrate. The automatic layout tool further connects two leading wirings provided for each capacitor electrode with other circuit elements according to the procedure of step 3.

In the semiconductor device designed according to the design method, a failure in capacitors can be detected by a DC test.

It is understood by those skilled in the art that the foregoing embodiment is simply illustrative and various changes and variations may be made in a combination of respective components or respective processes, and that such changes and variations are within the scope of the present invention.

The present embodiments have described a case where two connection wirings led out from a capacitor electrode are connected with a common side of the electrode but the present invention is not limited thereto. Which means that the two connection wirings may be respectively connected to different sides.

While the preferred embodiments of the present invention have been described using specific terms, such description is for illustrative purposes only, and it is to be understood that changes and variations may be made without departing from the spirit or scope of the appended claims.

What is claimed is:

1. A semiconductor device having a first wiring layer, a second wiring layer and an insulating layer provided between the first wiring layer and the second wiring layer,
   comprising a capacitor having a first electrode formed on the first wiring layer and a second electrode formed on the second wiring layer in such a manner that the second electrode overlaps with the first electrode, wherein
   two connection wirings are respectively connected to the first electrode and the second electrode, wherein
   the first electrode and the second electrode are rectangular and the two connection wirings connected to the first electrode are led out from different sides of the first electrode, and the two connection wirings connected to the second electrode are led out from different sides of the second electrode.

2. The semiconductor device according to claim 1, wherein
   the two connection wirings connected to the first electrode are connected to each other with low DC impedance substantially only through the first electrode, and the two connection wirings connected to the second electrode are connected to each other with low DC impedance substantially only through the second electrode.

3. The semiconductor device according to claim 1, wherein
   the first wiring layer is the uppermost wiring layer, and the second wiring layer is a wiring layer lower than the first wiring layer,
   the capacitor further includes:
   a via hole disposed along one side of the second electrode and
   a third electrode connected to the second electrode through the via hole and formed on the first wiring layer, and
   the two connection wirings connected to the second electrode are formed on the first wiring layer and led out from the third electrode.

4. A semiconductor device constructed by disposing a unit cell with the unit cell being a unit capacitor including:
   a first electrode formed on a first wiring layer;

a second electrode formed on a second wiring layer arranged to sandwich an insulating layer with the first wiring layer in such a manner that the second electrode overlaps with the first electrode;
two connection wirings connected to the first electrode; and
two connection wirings connected to the second electrode, wherein
the first electrode and the second electrode are rectangular and the two connection wirings connected to the first electrode are led out from different sides of the first electrode, and the two connection wirings connected to the second electrode are led out from different sides of the second electrode.

5. The semiconductor device according to claim 4, wherein
all the capacitors formed thereon are constructed with a unit capacitor as a unit cell.

* * * * *